US012615827B2

(12) United States Patent
Vaidya et al.

(10) Patent No.: US 12,615,827 B2
(45) Date of Patent: Apr. 28, 2026

(54) MEMORY CIRCUITRY COMPRISING STRINGS OF MEMORY CELLS

(71) Applicant: Micron Technology, Inc., Boise, ID (US)

(72) Inventors: Dhirendra Dhananjay Vaidya, Telangana (IN); Lei Wei, Boise, ID (US); Gurpreet Lugani, Boise, ID (US); Sumeet C. Pandey, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 1060 days.

(21) Appl. No.: 17/712,776

(22) Filed: Apr. 4, 2022

(65) Prior Publication Data

US 2023/0317800 A1 Oct. 5, 2023

(51) Int. Cl.
| | |
|---|---|
| *H10D 64/00* | (2025.01) |
| *H10B 41/27* | (2023.01) |
| *H10B 43/27* | (2023.01) |

(52) U.S. Cl.
CPC .......... *H10D 64/111* (2025.01); *H10B 41/27* (2023.02); *H10B 43/27* (2023.02)

(58) Field of Classification Search
CPC .............................. H10D 64/111; H10B 41/27
See application file for complete search history.

(56) References Cited

U.S. PATENT DOCUMENTS

| | | | | |
|---|---|---|---|---|
| 10,854,627 B1 * | 12/2020 | Moriyama | ............. | H10D 30/63 |
| 10,903,237 B1 * | 1/2021 | Hosoda | ............... | H01L 23/5283 |
| 12,137,567 B2 * | 11/2024 | Lu | .......................... | H10B 43/50 |
| 2018/0301374 A1 | 10/2018 | Masamori et al. | | |
| 2019/0043874 A1 * | 2/2019 | Thimmegowda | ........ | G11C 8/14 |

(Continued)

OTHER PUBLICATIONS

Huang et al., "Pattern dependent profile distortion during plasma etching of high aspect ratio features in SiO2", J. Vac. Sci. Technol. A 38, 023001, Jan. 8, 2020, United States, 13 pgs.

*Primary Examiner* — William B Partridge
*Assistant Examiner* — Linda J. Fleck
(74) *Attorney, Agent, or Firm* — Wells St. John P.S.

(57) ABSTRACT

Memory circuitry comprising strings of memory cells comprises laterally-spaced memory blocks individually comprising a vertical stack comprising alternating insulative tiers and conductive tiers directly above a conductor tier. The insulative tiers and the conductive tiers of the laterally-spaced memory blocks extend from a memory-array region into a stair-step region. Strings of memory cells comprise operative channel-material strings that extend through the insulative tiers and the conductive tiers in individual of the laterally-spaced memory blocks in the memory-array region. The operative channel-material strings directly electrically couple with conductor material of the conductor tier. The individual laterally-spaced memory blocks comprise an intermediate region between the operative channel-material strings and the stair-step region. A dummy through-array-via (TAV) extends through the insulative tiers and the conductive tiers in the intermediate region in the individual laterally-spaced memory blocks. The dummy TAV is directly electrically coupled with the operative channel-material strings in its memory block. Other embodiments are disclosed.

34 Claims, 10 Drawing Sheets

(56)          References Cited

U.S. PATENT DOCUMENTS

| | | | | |
|---|---|---|---|---|
| 2019/0081061 | A1 | 3/2019 | Tessariol et al. | |
| 2020/0328222 | A1* | 10/2020 | Barclay | H10B 43/10 |
| 2021/0043644 | A1* | 2/2021 | Hu | H10B 41/27 |
| 2021/0057441 | A1 | 2/2021 | Xu et al. | |
| 2021/0057444 | A1* | 2/2021 | Park | H10B 41/50 |
| 2021/0335809 | A1* | 10/2021 | Kim | H10B 43/10 |
| 2022/0149067 | A1* | 5/2022 | Hopkins | H10B 43/35 |
| 2024/0196620 | A1* | 6/2024 | Yim | H10B 43/27 |
| 2024/0321727 | A1* | 9/2024 | Machkaoutsan | H10B 43/10 |

* cited by examiner

MEMORY CIRCUITRY COMPRISING STRINGS OF MEMORY CELLS

TECHNICAL FIELD

Embodiments disclosed herein pertain to memory circuitry comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Figure 1:
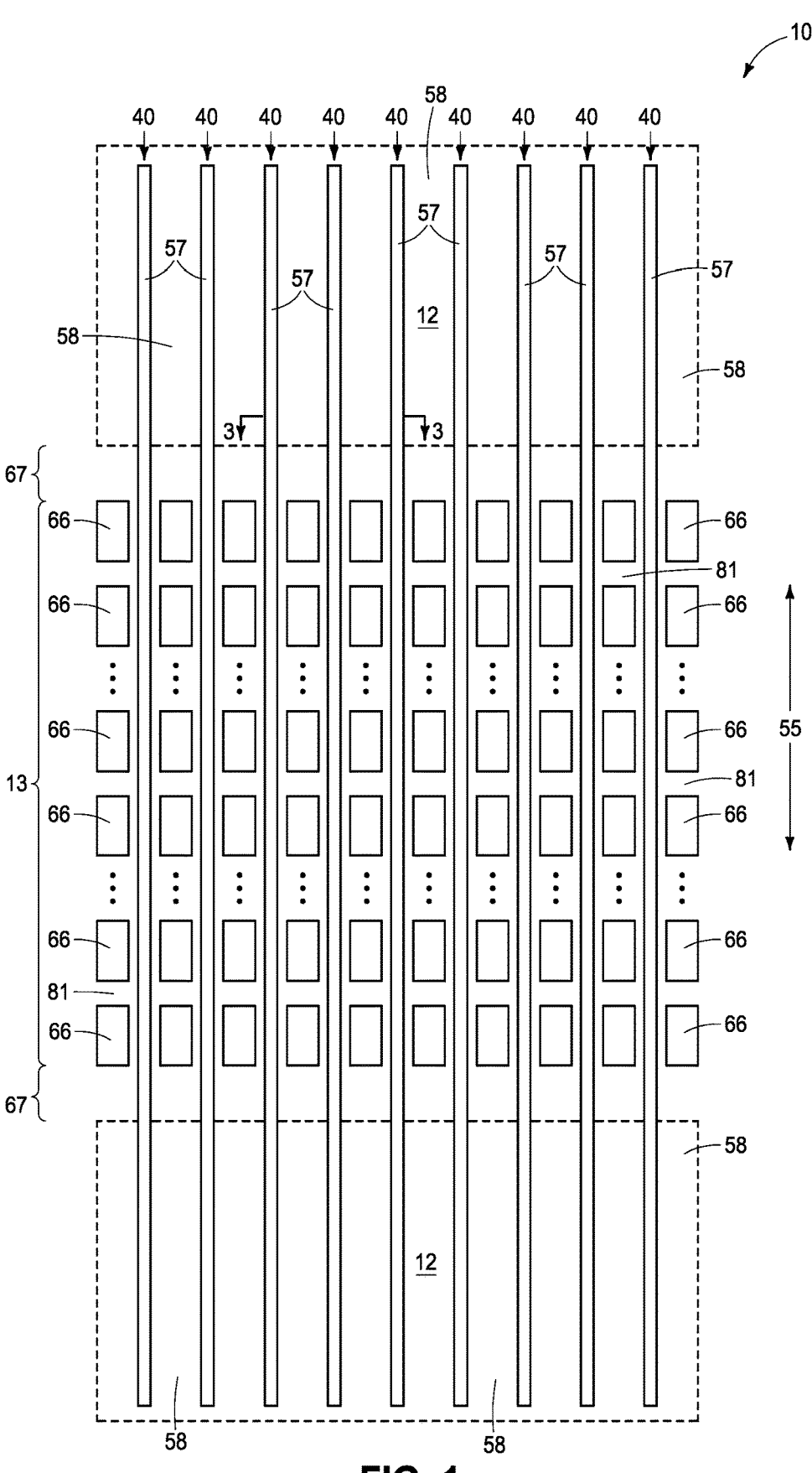
FIG. 1 is a diagrammatic view of a portion of memory circuitry comprising strings of memory cells in accordance with an embodiment of the invention.
Figure 2:
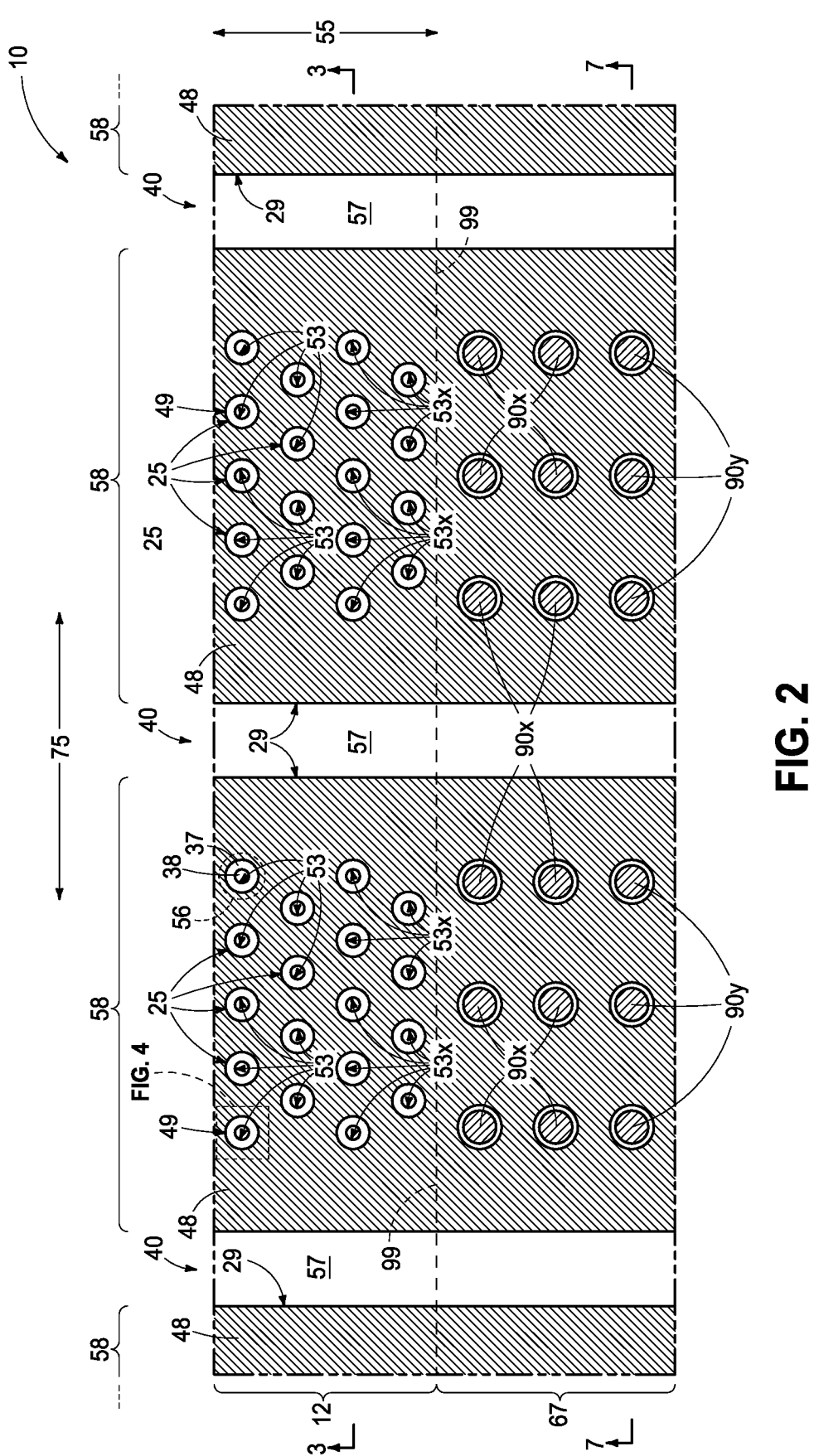
FIGS. 2-12 are diagrammatic sectional, expanded, enlarged, and/or partial views of the construction of FIG. 1 or portions thereof, and/or of alternate embodiments thereof.
Figure 3:
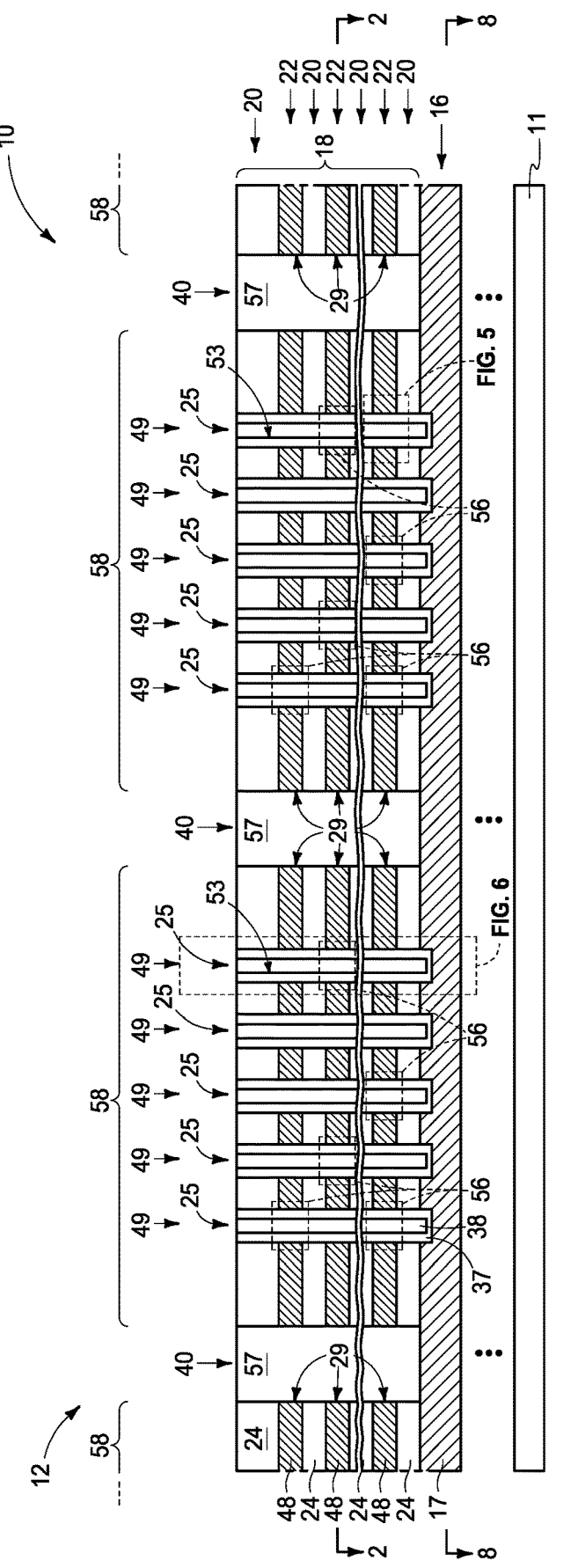

FIGS. 1-8 show a construction 10 comprising memory circuitry having two memory-array regions 12 comprising elevationally-extending strings 49 of transistors and/or memory cells 56 (e.g., comprising NAND). A stair-step region 13 is between memory-array regions 12. Construction 10 may comprise only a single memory-array region 12 or may comprise more than two memory-array regions 12 (neither being shown). Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-8-depicted materials. For example, other partially or wholly fabricated components of integrated circuitry may be provided somewhere above, about, or within base substrate 11. Control and/or other peripheral circuitry for operating components within an array (e.g., individual array regions 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 (e.g., $WSi_x$ atop conductively-doped polysilicon) is above substrate 11. Conductor tier 16 may comprise part of control circuitry (e.g., peripheral-under-array circuitry and/or a common source line or plate) used to control read and write access to the transistors and/or memory cells in array 12. A vertical stack 18 comprising vertically-alternating insulative tiers 20 and conductive tiers 22 is directly above conductor tier 16. In some embodiments, conductive tiers 22 may be referred to as first tiers 22 and insulative tiers 20 may be referred to as second tiers 20. Insulative tiers 20 and conductive tiers 22 extend from memory-array region 12 into stair-step region 13. Example thickness for each of tiers 20 and 22 is 20 to 60 nanometers. The example uppermost tier 20 may be thicker/thickest compared to one or more other tiers 20 and/or 22. Only a small number of tiers 20 and 22 is shown in FIGS. 2-8, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22 (not shown). Alternately or additionally, at least one of the depicted uppermost and lowest conductive tiers 22 may be a select gate tier. Example insulative tiers 20 comprise insulative material 24 (e.g., silicon dioxide and/or other material that may be of one or more composition(s)).

Channel openings 25 have been formed (e.g., by etching) through insulative tiers 20 and conductive tiers 22 to conductor tier 16. Channel openings 25 may taper radially-inward and/or radially-outward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory blocks 58. In this document, "block" is generic to include "sub-block". Memory blocks 58 may be considered as being longitudinally elongated and oriented, for example along a first direction 55. Any alternate existing or future-developed arrangement and construction may be used.

The two memory-array regions 12 may be of the same or different constructions relative one another. Regardless, operative channel-material strings (e.g., 53) of memory cells (e.g., 56) extend through the insulative tiers (e.g., 20) and the conductive tiers (e.g., 22) in memory blocks (e.g., 58) in each of two memory-array regions 12.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

Example memory blocks 58 are shown as at least in part having been defined by horizontally-elongated trenches 40 that were formed (e.g., by anisotropic etching) into stack 18. Trenches 40 will typically be wider than channel openings 25 (e.g., 2 to 10 times wider). Trenches 40 may have respective bottoms that are directly against conductor material 17 (e.g., atop or within) of conductor tier 16 (as shown) or may have respective bottoms that are above conductor material 17 of conductor tier 16 (not shown). Walls 57 are individually in trenches 40 between immediately-laterally-adjacent memory blocks 58 (i.e., there being no other memory block 58 laterally between memory blocks 58 that are immediately-laterally-adjacent one another). Walls 57 may provide lateral electrical isolation (insulation) between immediately-laterally-adjacent memory blocks 58. Walls 57 may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, and $Al_2O_3$. Walls 57 may taper laterally inward and/or outward in vertical cross-section (not shown). Walls 57 may include through-array-vias (TAVs, and not shown).

Figure 6:
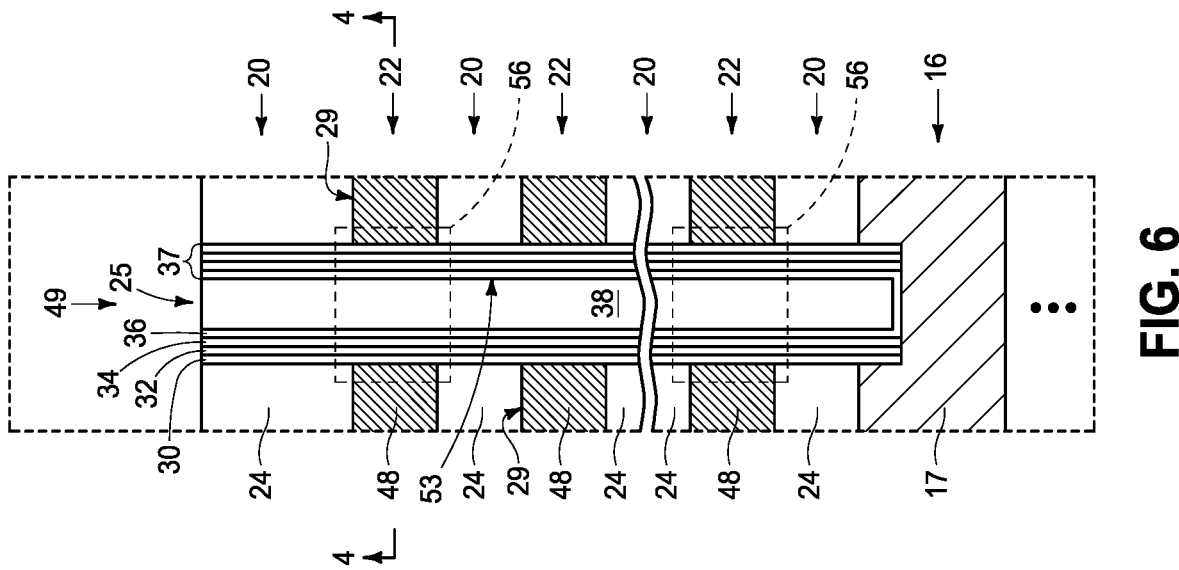
Figure 4:
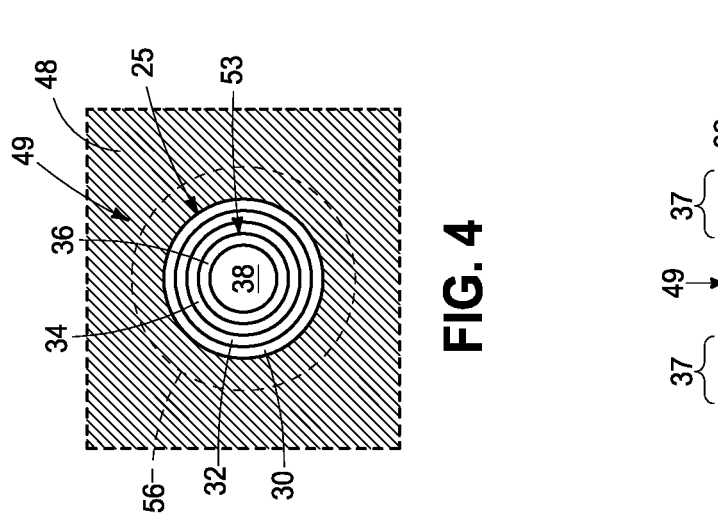
Figure 5:
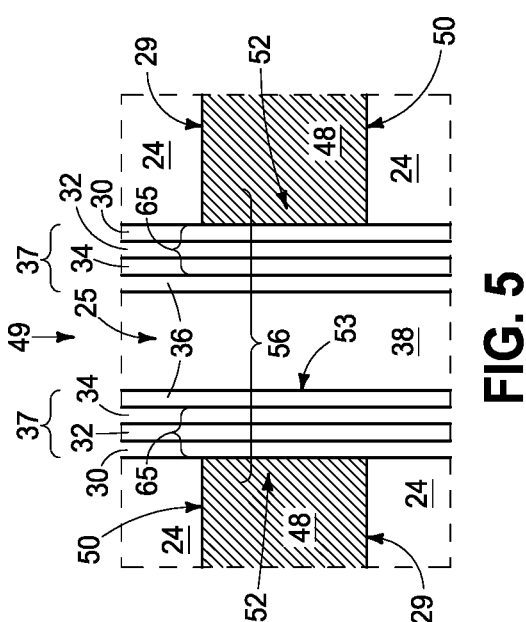
Figure 7:
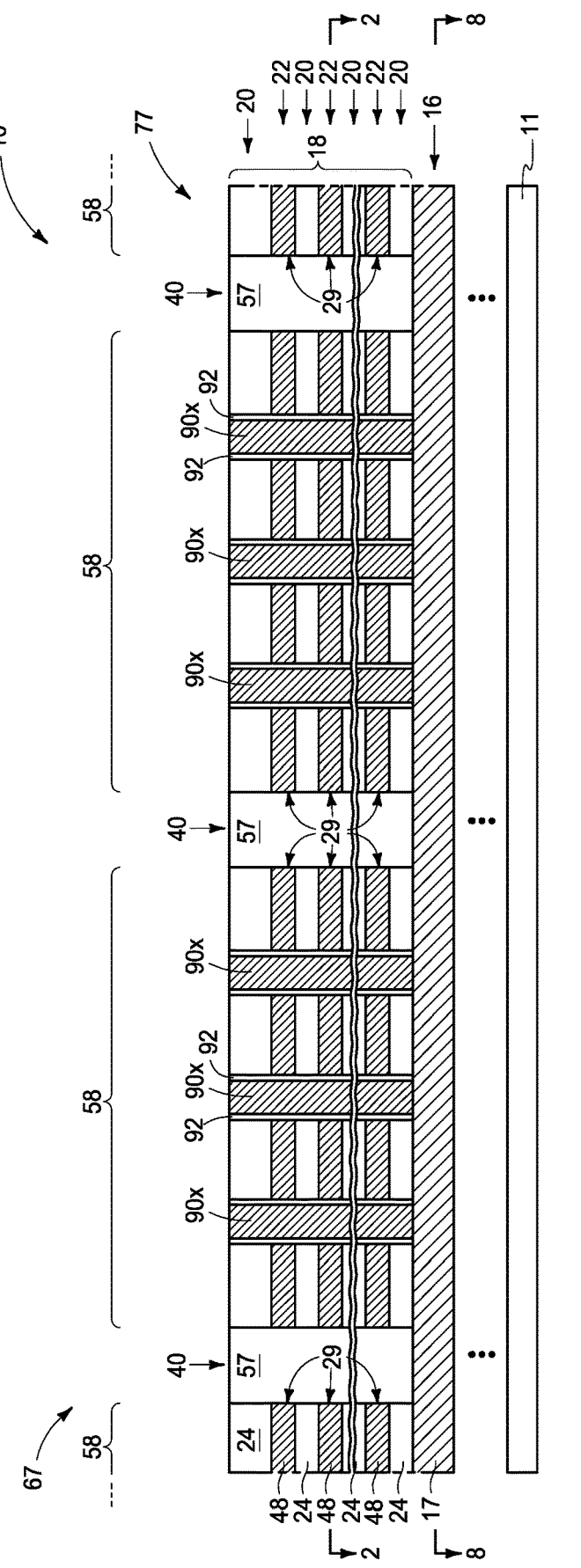

FIGS. 4-6 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18 as shown.

Channel material 36 has also been formed in channel openings 25 elevationally along insulative tiers 20 and conductive tiers 22 and comprise individual operative channel-material strings 53 in one embodiment having memory-cell materials (e.g., 30, 32, and 34) there-along and with material 24 in insulative tiers 20 being horizontally-between immediately-adjacent operative channel-material strings 53. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 (operative channel-material string 53) is directly electrically coupled with conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Example conductive tiers 22 comprise conducting material 48 that is part of individual conductive lines 29 (e.g., wordlines) that extend across stair-step region 13 along first direction 55 into and within individual memory blocks 58 in each of two memory-array regions 12 (e.g., around/aside stair-step structures 66, referred to below). Conductive lines 29 comprise part of elevationally-extending strings 49 of individual transistors and/or memory cells 56. A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Example stair-step region 13 comprises stair-step structures 66 that are laterally between immediately-adjacent walls 57 and have a crest 81 adjacent and longitudinally there-between along direction 55. Stair-step structures 66 have stairs (not shown) to which conductive vias (not shown) electrically connect for controlling/accessing conductive lines 29 and are otherwise not pertinent to the inventions.

In one embodiment, individual laterally-spaced memory blocks 58 comprise an intermediate region 67 between operative channel-material strings 53 and stair-step region 13. Example through-array-vias (TAVs) 90* individually extend through insulative tiers 20 and conductive tiers 22 in individual memory blocks 58 (an * being used as a suffix to be inclusive of all such same-numerically-designated components that may or may not have other suffixes). Example TAVs 90* have an example insulative-material lining 92 circumferentially there-about. TAVs may be operative, meaning a circuit-operative conductive interconnect extending through a stack and between electronic components at different elevations in a finished construction of integrated circuitry that has been or is being fabricated. TAVs mays may also be dummy (e.g., a structure extending through a stack that is circuit-inoperative in electrically coupling electronic components at different elevations in a finished construction of integrated circuitry that has been or is being fabricated). TAVs 90* include a dummy TAV 90x in intermediate region 67 and that is directly electrically coupled with operative channel-material strings 53 in its memory block 58. In one embodiment and as shown, construction 10 comprises multiple dummy TAVs 90x in intermediate region 67 in individual memory blocks 58 and that are directly electrically coupled with operative channel-material strings 53 in its memory block 58. In one such embodiment, individual memory blocks 58 are longitudinally elongated along a horizontal direction (e.g., 55), with multiple dummy TAVs 90x being in a row 77 that is angled (e.g., orthogonally) relative to horizontal direction 55 (e.g., along a direction 75), and in one such embodiment as shown comprises multiple rows 77. In one embodiment, rows 77 number no more than three and in another embodiment, there is only one row 77 (not shown).

A dummy channel-material string 53x (multiple being shown) is between operative channel-material strings 53 and dummy TAV 90x. Strings 49 of individual transistors and/or memory cells 56 if comprising a dummy channel-material string 53x will be dummy (inoperative).

Figure 8:
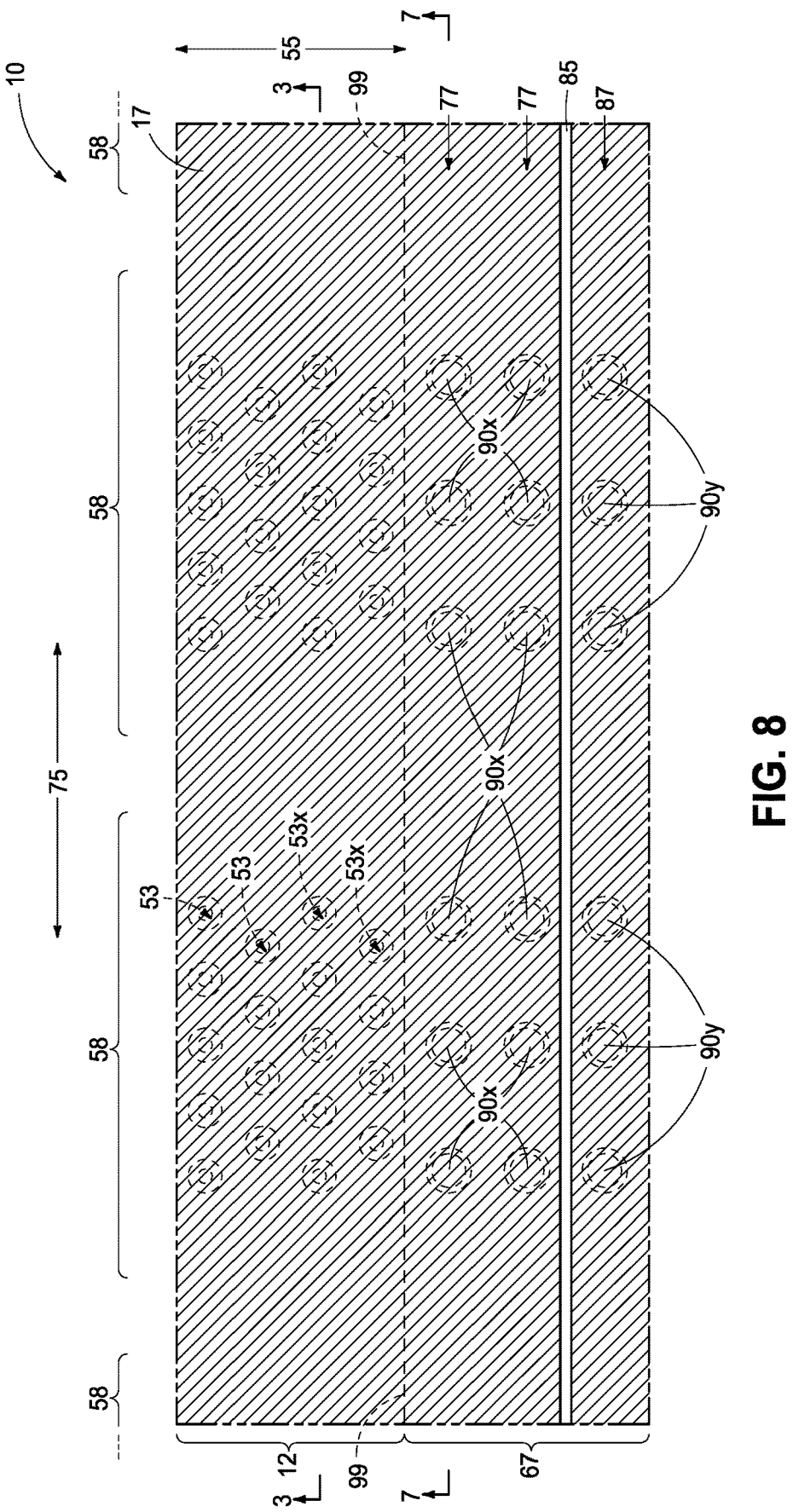
Figure 9:
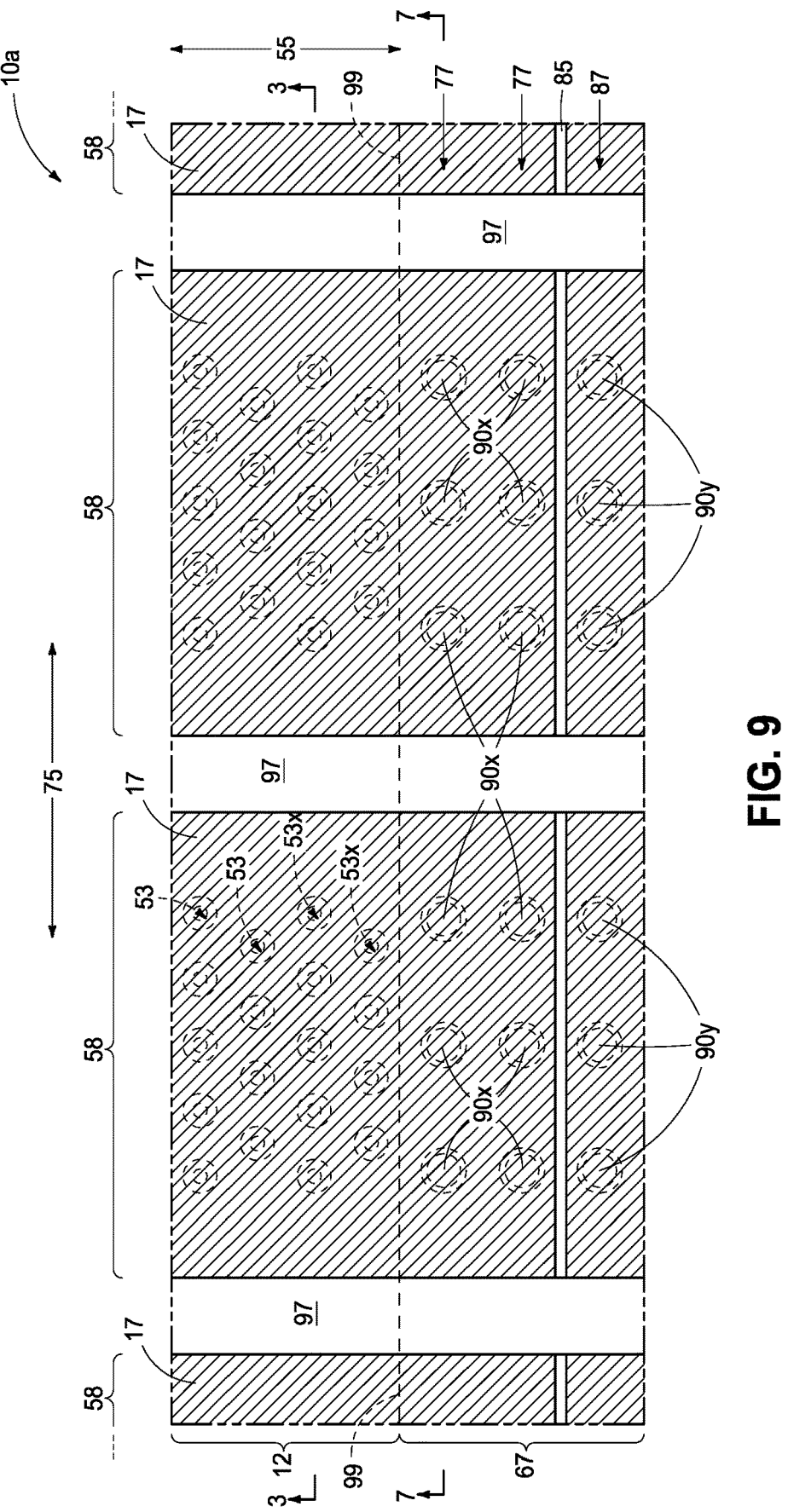
Figure 10:
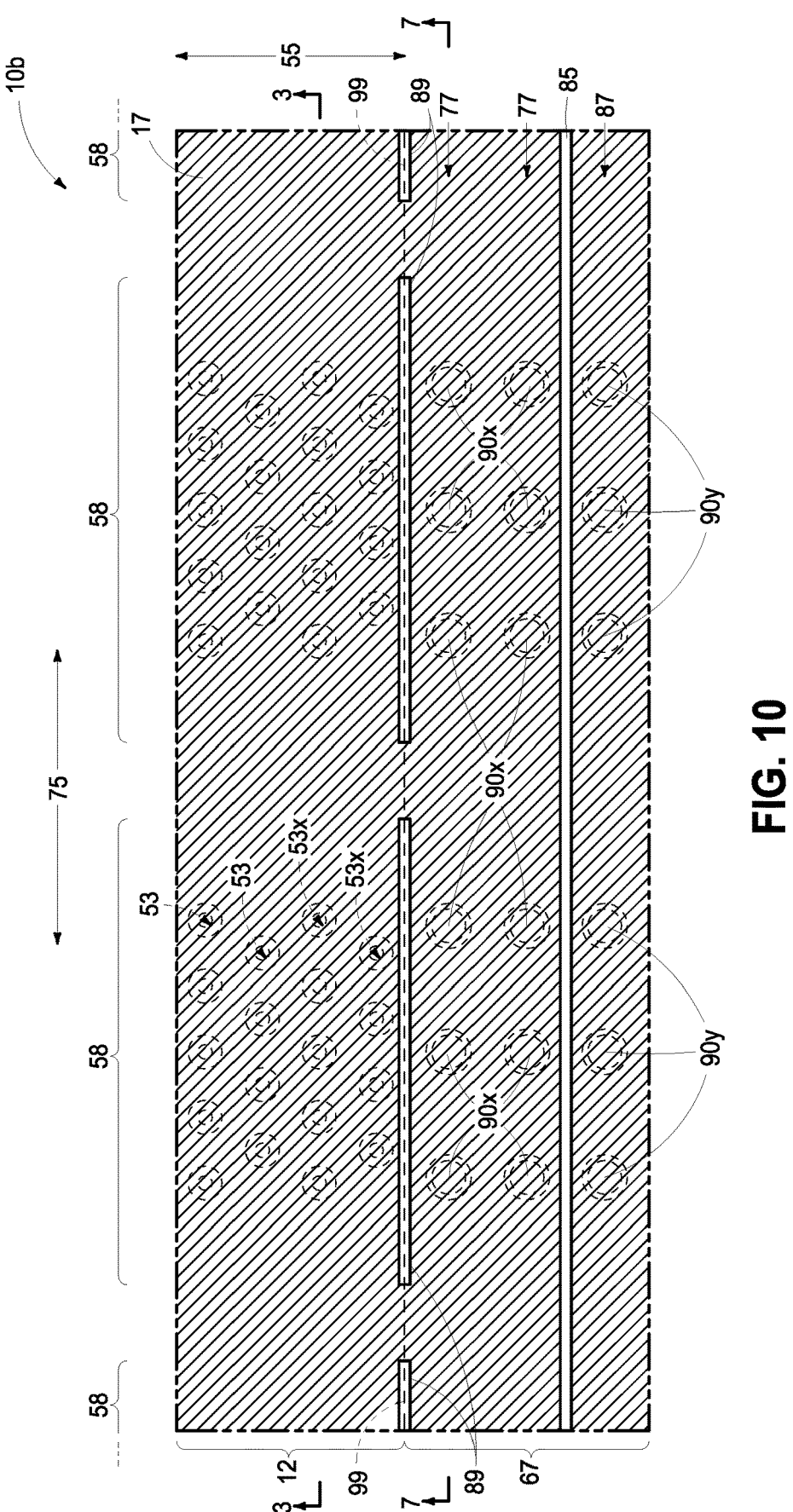

In one embodiment, dummy TAV 90x is directly electrically coupled with operative channel-material strings 53 in its memory block 58 through conductor material 17 of conductor tier 16 that is in its memory block 58 and that extends across an interface 99 of memory-array region 12 and intermediate region 67. In one embodiment, conductor material 17 of conductor tier 16 spans between immediately-adjacent individual memory blocks 58 and dummy TAV 90x is directly electrically coupled with operative channel-material strings 53 in its memory block through some of conductor material 17 that spans between laterally-spaced memory blocks 58. FIG. 8 shows an example embodiment where such direct electrical coupling is through both. FIG. 9 shows an example alternate construction 10a where such direct electrical connection is only through conductor material 17 across interface 99 (due to example insulative material 97 beneath walls 57 in conductor tier 16 [walls 57 not being visible in FIG. 9]). FIG. 10 shows an example alternate construction 10b where such direct electrical connection is only through some of conductor material 17 that spans between immediately-adjacent individual memory blocks 58 in conductor tier 16 (due to example insulative wall 89 along interface 99 in individual blocks 58). Like numerals from the above-described embodiments have been used where appropriate, with some construction differences being indicated with the suffixes "a" or "b" in FIGS. 9 and 10, respectively.

Any other attribute(s) or aspect(s) as shown and/or described herein with respect to other embodiments may be used.

In one embodiment, an other dummy TAV 90$y$ extends through insulative tiers 20 and conductive tiers 22 in intermediate region 67 and that is not directly electrically coupled with operative channel-material strings 53 in its memory block 58. By way of example only, construction 10 shows three other dummy TAVs 90$y$ in a row 87, and that are separated from conductor material 17 in conductor tier 16 by an insulative wall 85. Wall 85 may only be in conductor tier 16 or may extend upwardly as well through stack 18. Regardless, alternately and or additionally, one or more of TAVs 90$x$ and/or 90$y$ may be substituted with an operative/live TAV 90 (not shown). Further, conductor tier 16 may comprise a region or regions of insulative material therein (not shown) atop which one or more of dummy TAVs 90$y$ land.

Figure 11:
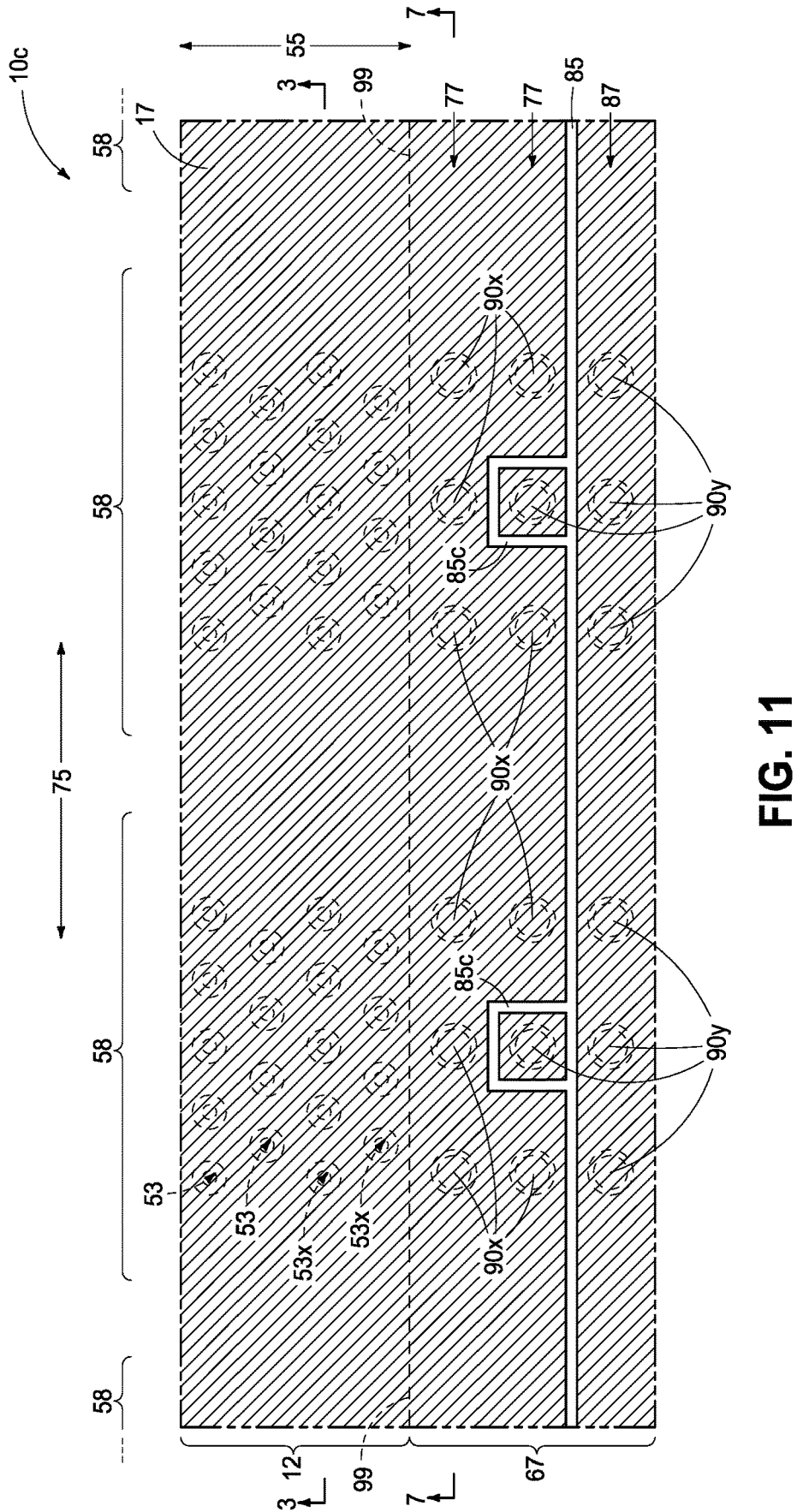

An alternate construction 10$c$ in FIG. 11 has a dummy TAV 90$y$ in a row 77 that is surrounded by an insulative wall (e.g., 85$c$ plus 85). Like numerals from the above-described embodiments have been used where appropriate, with some construction differences being indicated with the suffix "c". Any other attribute(s) or aspect(s) as shown and/or described herein with respect to other embodiments may be used.

Figure 12:
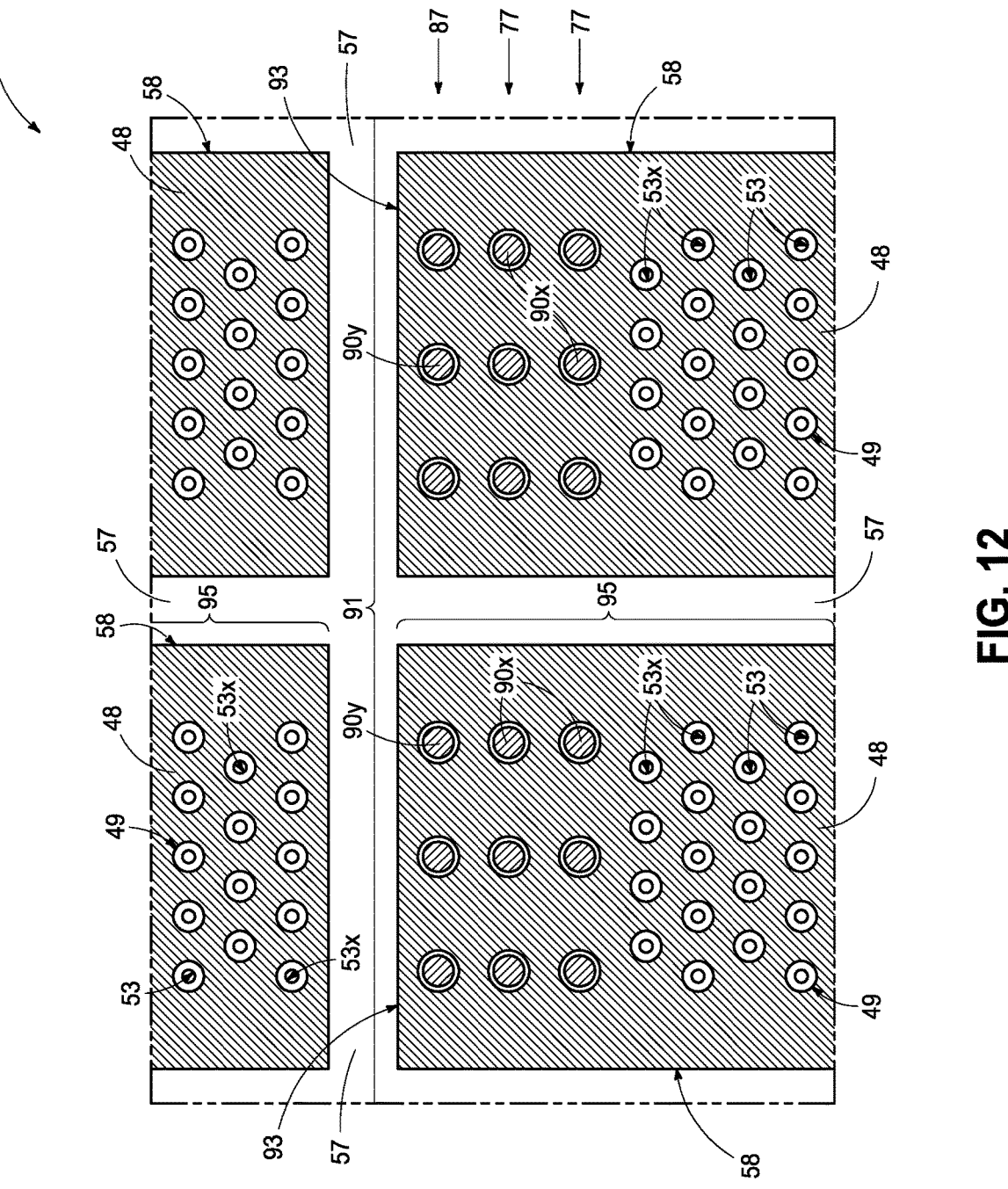

Another example embodiment construction 10$d$ in accordance with the invention is partially shown in FIG. 12. Like numerals from the above-described embodiments have been used where appropriate, with some construction differences being indicated with the suffix "d" or with different numerals. Construction 10$d$ may have any of the attributes of FIGS. 1-11 independent of presence of or proximity to a stair-step region and/or an intermediate region. Construction 10$d$ comprises memory circuitry comprising strings (e.g., 49) of memory cells (e.g., 56) comprising laterally-spaced memory blocks (e.g., 58) individually comprising a vertical stack (e.g., 18) comprising alternating insulative tiers (e.g., 20) and conductive tiers (e.g., 22) directly above a conductor tier (e.g., 16). The strings of memory cells comprise operative channel-material strings (e.g., 53) that extend through the insulative tiers and the conductive tiers (e.g., at least in memory blocks 58 that are below wall 57 [referred to below]). The operative channel-material strings directly electrically couple with conductor material (e.g., 17) of the conductor tier. A wall (e.g., 57) extends through the insulative tiers and the conductive tiers. The wall includes an intervening portion (e.g., 95) that is laterally between two immediately-adjacent of the laterally-spaced memory blocks. The wall includes an end portion (e.g., 91) that joins with the intervening portion and spans across an end (e.g., 93) of individual of the two immediately-adjacent laterally-spaced memory blocks. A dummy TAV (e.g., 90$x$) extends through the insulative tiers and the conductive tiers in the individual two immediately-adjacent memory blocks. The dummy TAV is directly electrically coupled with the operative channel-material strings in its memory block. FIG. 12 by way of example shows portions of four memory blocks 58 and dummy TAVs 90\* in the lower two but not the top two. Alternately, by way of examples, dummy TAVs could only be in one, three, or all four of the example depicted memory block portions.

In one embodiment, the dummy TAV is directly electrically coupled with the operative channel-material strings in its memory block through the conductor material of the conductor tier that is in its memory block and that is not directly under the wall (e.g., that portion of conductor material 17 crossing interface 99 in FIGS. 8, 9, and/or 11 regardless of any presence of such conductor material laterally between the two immediately-laterally-adjacent memory blocks 58). In one embodiment, the conductor material of the conductor tier spans between the two immediately-adjacent memory blocks directly under the wall and the dummy TAV is directly electrically coupled with the operative channel-material strings in its memory block through some of the conductor material that spans between the two immediately-adjacent laterally-spaced memory blocks directly under the wall (e.g., some of that portion of conductor material 17 that is laterally between the two immediately-laterally-adjacent memory blocks 58 in FIGS. 8, 10, and/or 11 regardless of any presence of such conductor material crossing interface 99). In one embodiment, the dummy TAV is directly electrically coupled with the operative channel-material strings in its memory block through both (e.g., FIGS. 8 and/or 11).

In one embodiment, the dummy TAV is between all of the operative channel-material strings in its block and the end portion of the wall, and in one such embodiment comprising a dummy channel-material string between the operative channel-material strings and the dummy TAV. In one embodiment, construction 10$d$ comprises multiple of the dummy TAVs that individually extend through the insulative tiers and the conductive tiers in the individual two laterally-spaced memory blocks and that are directly electrically coupled with the operative channel-material strings in its memory block, and in one such embodiment wherein all of the multiple dummy TAVs are between all of the operative channel-material strings in its block and the end portion of the wall. Again, conductor tier 16 may comprise a region or regions of insulative material therein (not shown) atop which one or more of dummy TAVs 90$y$ land (when dummy TAVs 90$y$ are present).

Any other attribute(s) or aspect(s) as shown and/or described herein with respect to other embodiments may be used.

Presence and example position of one or more dummy TAVs 90$x$ that are directly electrically coupled to channel-material strings 53\* as provided herein, during manufacture and/or in operation in a finished construction, may reduce electric field resulting in improved manufacture and reduced defects in operation.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/ drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/ component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/ conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, memory circuitry comprising strings of memory cells comprises laterally-spaced memory blocks individually comprising a vertical stack comprising alternating insulative tiers and conductive tiers directly above a conductor tier. The insulative tiers and the conductive tiers of the laterally-spaced memory blocks extend from a memory-array region into a stair-step region. Strings of memory cells comprise operative channel-material strings that extend through the insulative tiers and the conductive tiers in individual of the laterally-spaced memory blocks in the memory-array region. The operative channel-material strings directly electrically couple with conductor material of the conductor tier. The individual laterally-spaced memory blocks comprise an intermediate region between the operative channel-material strings and the stair-step region. A dummy through-array-via (TAV) extends through the insulative tiers and the conductive tiers in the intermediate region in the individual laterally-spaced memory blocks. The dummy TAV is directly electrically coupled with the operative channel-material strings in its memory block.

In some embodiments, memory circuitry comprising strings of memory cells comprises laterally-spaced memory blocks individually comprising a vertical stack comprising alternating insulative tiers and conductive tiers directly above a conductor tier. The insulative tiers and the conductive tiers of the laterally-spaced memory blocks extend from a memory-array region into a stair-step region. Strings of memory cells comprise operative channel-material strings that extend through the insulative tiers and the conductive tiers in individual of the laterally-spaced memory blocks in the memory-array region. The operative channel-material strings directly electrically couple with conductor material of the conductor tier. The individual laterally-spaced memory blocks comprise an intermediate region between the operative channel-material strings and the stair-step region. A dummy through-array-via (TAV) extends through the insulative tiers and the conductive tiers in the intermediate region in the individual laterally-spaced memory blocks. The dummy TAV is directly electrically coupled with the operative channel-material strings in its memory block through the conductor material of the conductor tier that is in its memory block and that extends across an interface of the memory-array region and the intermediate region.

In some embodiments, memory circuitry comprising strings of memory cells comprises laterally-spaced memory blocks individually comprising a vertical stack comprising alternating insulative tiers and conductive tiers directly above a conductor tier. The insulative tiers and the conductive tiers of the laterally-spaced memory blocks extend from a memory-array region into a stair-step region. Strings of memory cells comprise operative channel-material strings that extend through the insulative tiers and the conductive tiers in individual of the laterally-spaced memory blocks in the memory-array region. The operative channel-material strings directly electrically couple with conductor material of the conductor tier. The individual laterally-spaced memory blocks comprise an intermediate region between the operative channel-material strings and the stair-step region. A dummy through-array-via (TAV) extends through the insulative tiers and the conductive tiers in the intermediate region in the individual laterally-spaced memory blocks. The conductor material of the conductor tier spans between immediately-adjacent of the laterally-spaced memory blocks. The dummy TAV is directly electrically coupled with the operative channel-material strings in its memory block through some of the conductor material that spans between the immediately-adjacent laterally-spaced memory blocks.

In some embodiments, memory circuitry comprising strings of memory cells comprises laterally-spaced memory blocks individually comprising a vertical stack comprising alternating insulative tiers and conductive tiers directly above a conductor tier. Strings of memory cells comprise operative channel-material strings that extend through the insulative tiers and the conductive tiers. The operative channel-material strings directly electrically couple with conductor material of the conductor tier. A wall extends through the insulative tiers and the conductive tiers. The wall includes an intervening portion that is laterally between two immediately-adjacent of the laterally-spaced memory blocks. The wall includes an end portion that joins with the intervening portion and spans across an end of individual of the two immediately-adjacent laterally-spaced memory blocks. A dummy through-array-via (TAV) extends through the insulative tiers and the conductive tiers in the individual two immediately-adjacent memory blocks. The dummy TAV is directly electrically coupled with the operative channel-material strings in its memory block.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Memory circuitry comprising strings of memory cells, comprising:

laterally-spaced memory blocks individually comprising a vertical stack comprising alternating insulative tiers and conductive tiers directly above a conductor tier, the insulative tiers and the conductive tiers of the laterally-spaced memory blocks extending from a memory-array region into a stair-step region;

strings of memory cells comprising operative channel-material strings that extend through the insulative tiers and the conductive tiers in individual of the laterally-spaced memory blocks in the memory-array region, the operative channel-material strings directly electrically coupling with conductor material of the conductor tier; and the individual laterally-spaced memory blocks comprising an intermediate region between the operative channel-material strings and the stair-step region, a dummy through-array-via (TAV) that extends through the insulative tiers and the conductive tiers in the intermediate region in the individual laterally-spaced memory blocks, the dummy TAV comprising a conductive interconnect structure distinct from a structure of the operative-channel material strings and being directly electrically coupled with the operative channel-material strings in its memory block.

2. The memory circuitry of claim 1 comprising an other dummy TAV that extends through the insulative tiers and the conductive tiers in the intermediate region and that is not directly electrically coupled with the operative channel-material strings in its memory block.

3. The memory circuitry of claim 1 comprising a dummy channel-material string between the operative channel-material strings and the dummy TAV.

4. The memory circuitry of claim 1 comprising multiple of the dummy TAVs that individually extend through the insulative tiers and the conductive tiers in the intermediate region in the individual laterally-spaced memory blocks and that are directly electrically coupled with the operative channel-material strings in its memory block.

5. The memory circuitry of claim 4 comprising multiple dummy channel-material strings between the operative channel-material strings and the dummy TAVs.

6. The memory circuitry of claim 4 wherein the individual laterally-spaced memory blocks are longitudinally elongated along a horizontal direction, the multiple dummy TAVs are in a row that is angled relative to the horizontal direction.

7. The memory circuitry of claim 6 comprising multiple of the rows.

8. The memory circuitry of claim 7 wherein the rows number no more than three.

9. The memory circuitry of claim 6 having only one of said row.

10. The memory circuitry of claim 6 comprising an other dummy TAV in the row that extends through the insulative tiers and the conductive tiers and that is not directly electrically coupled with the operative channel-material strings in its memory block.

11. Memory circuitry comprising strings of memory cells, comprising:

laterally-spaced memory blocks individually comprising a vertical stack comprising alternating insulative tiers and conductive tiers directly above a conductor tier, the insulative tiers and the conductive tiers of the laterally-spaced memory blocks extending from a memory-array region into a stair-step region;

strings of memory cells comprising operative channel-material strings that extend through the insulative tiers and the conductive tiers in individual of the laterally-spaced memory blocks in the memory-array region, the operative channel-material strings directly electrically coupling with conductor material of the conductor tier; and the individual laterally-spaced memory blocks comprising an intermediate region between the operative channel-material strings and the stair-step region, a dummy through-array-via (TAV) that extends through the insulative tiers and the conductive tiers in the intermediate region in the individual laterally-spaced memory blocks, the dummy TAV comprising a conductive interconnect structure distinct from a structure of the operative-channel material strings and being directly electrically coupled with the operative channel-material strings in its memory block through the conductor material of the conductor tier that is in its memory block and that extends across an interface of the memory-array region and the intermediate region.

12. The memory circuitry of claim 11 wherein the conductor material of the conductor tier spans between immediately-adjacent of the laterally-spaced memory blocks, the dummy TAV also being directly electrically coupled with the operative channel-material strings in its memory block through some of the conductor material that spans between the immediately-adjacent laterally-spaced memory blocks.

13. The memory circuitry of claim 11 comprising an other dummy TAV that extends through the insulative tiers and the conductive tiers in the intermediate region and that is not directly electrically coupled with the operative channel-material strings in its memory block.

14. The memory circuitry of claim 11 comprising a dummy channel-material string between the operative channel-material strings and the dummy TAV.

15. The memory circuitry of claim 11 comprising multiple of the dummy TAVs that individually extend through the insulative tiers and the conductive tiers in the intermediate region in the individual laterally-spaced memory blocks and that are directly electrically coupled with the operative channel-material strings in its memory block.

16. The memory circuitry of claim 15 wherein the individual laterally-spaced memory blocks are longitudinally elongated along a horizontal direction, the multiple dummy TAVs are in a row that is angled relative to the horizontal direction.

17. Memory circuitry comprising strings of memory cells, comprising:

laterally-spaced memory blocks individually comprising a vertical stack comprising alternating insulative tiers and conductive tiers directly above a conductor tier, the insulative tiers and the conductive tiers of the laterally-spaced memory blocks extending from a memory-array region into a stair-step region;

strings of memory cells comprising operative channel-material strings that extend through the insulative tiers and the conductive tiers in individual of the laterally-spaced memory blocks in the memory-array region, the operative channel-material strings directly electrically coupling with conductor material of the conductor tier; and the individual laterally-spaced memory blocks comprising an intermediate region between the operative channel-material strings and the stair-step region, a dummy through-array-via (TAV) that extends through the insulative tiers and the conductive tiers in the intermediate region in the individual laterally-spaced memory blocks, the conductor material of the conductor tier spanning between immediately-adjacent of the laterally-spaced memory blocks, the dummy TAV comprising a conductive interconnect structure distinct from a structure of the operative-channel material strings and being directly electrically coupled with the operative channel-material strings in its memory block through some of the conductor material that spans between the immediately-adjacent laterally-spaced memory blocks.

18. The memory circuitry of claim 17 comprising an other dummy TAV that extends through the insulative tiers and the conductive tiers in the intermediate region and that is not directly electrically coupled with the operative channel-material strings in its memory block.

19. The memory circuitry of claim 17 comprising a dummy channel-material string between the operative channel-material strings and the dummy TAV.

20. The memory circuitry of claim 17 comprising multiple of the dummy TAVs that individually extend through the insulative tiers and the conductive tiers in the intermediate region in the individual laterally-spaced memory blocks and that are directly electrically coupled with the operative channel-material strings in its memory block.

21. The memory circuitry of claim 20 wherein the individual laterally-spaced memory blocks are longitudinally elongated along a horizontal direction, the multiple dummy TAVs are in a row that is angled relative to the horizontal direction.

22. Memory circuitry comprising strings of memory cells, comprising:

laterally-spaced memory blocks individually comprising a vertical stack comprising alternating insulative tiers and conductive tiers directly above a conductor tier, strings of memory cells comprising operative channel-material strings that extend through the insulative tiers and the conductive tiers, the operative channel-material strings directly electrically coupling with conductor material of the conductor tier;

a wall that extends through the insulative tiers and the conductive tiers, the wall including an intervening portion that is laterally between two immediately-adjacent of the laterally-spaced memory blocks, the wall including an end portion that joins with the intervening portion and spans across an end of individual of the two immediately-adjacent laterally-spaced memory blocks; and a dummy through-array-via (TAV) that extends through the insulative tiers and the conductive tiers in the individual two immediately-adjacent memory blocks, the dummy TAV comprising a conductive interconnect structure distinct from a structure of the operative-channel material strings and being directly electrically coupled with the operative channel-material strings in its memory block.

23. The memory circuitry of claim 22 wherein the dummy TAV is directly electrically coupled with the operative channel-material strings in its memory block through the conductor material of the conductor tier that is in its memory block and that is not directly under the wall.

24. The memory circuitry of claim 22 wherein the conductor material of the conductor tier spans between the two immediately-adjacent memory blocks directly under the wall, the dummy TAV being directly electrically coupled with the operative channel-material strings in its memory block through some of the conductor material that spans between the two immediately-adjacent laterally-spaced memory blocks directly under the wall.

25. The memory circuitry of claim 24 wherein the dummy TAV is also directly electrically coupled with the operative channel-material strings in its memory block through the conductor material of the conductor tier that is in its memory block and that is not directly under the wall.

26. The memory circuitry of claim 22 wherein the dummy TAV is between all of the operative channel-material strings in its block and the end portion of the wall.

27. The memory circuitry of claim 26 comprising a dummy channel-material string between the operative channel-material strings and the dummy TAV.

28. The memory circuitry of claim 23 comprising multiple of the dummy TAVs that individually extend through the insulative tiers and the conductive tiers in the individual two laterally-spaced memory blocks and that are directly electrically coupled with the operative channel-material strings in its memory block.

29. The memory circuitry of claim 28 wherein all of the multiple dummy TAVs are between all of the operative channel-material strings in its block and the end portion of the wall.

30. The memory circuitry of claim 29 comprising multiple dummy channel-material strings between the operative channel-material strings and the dummy TAVs.

31. The memory circuitry of claim 28 wherein the individual two laterally-spaced memory blocks are longitudinally elongated along a horizontal direction, the multiple dummy TAVs are in a row that is angled relative to the horizontal direction.

32. The memory circuitry of claim 31 comprising multiple of the rows.

33. The memory circuitry of claim 32 wherein the rows number no more than three.

34. The memory circuitry of claim 31 having only one of said row.

* * * * *